(12) United States Patent
Siamak et al.

(10) Patent No.: US 7,858,423 B2
(45) Date of Patent: Dec. 28, 2010

(54) MEMS BASED RF COMPONENTS WITH VERTICAL MOTION AND PARALLEL-PLATE STRUCTURE AND MANUFACTURE THEREOF USING STANDARD CMOS TECHNOLOGIES

(76) Inventors: Fouladi Azarnaminy Siamak, 601 Columbia Forest Blvd., Waterloo, Ontario (CA) N2V 2K7; Maher Bakri-Kassem, 204 Elderberry Hill Ct., Cary, NC (US) 27513; Mansour Raafat R., 610 Amberwood Drive, Waterloo, Ontario (CA) N2T 2G2

(*) Notice: Subject to any disclaimer, the term of this patent is extended or adjusted under 35 U.S.C. 154(b) by 129 days.

(21) Appl. No.: 12/131,890

(22) Filed: Jun. 2, 2008

(65) Prior Publication Data

US 2009/0296307 A1    Dec. 3, 2009

(51) Int. Cl.
*H01L 21/00* (2006.01)

(52) U.S. Cl. .................................. 438/52; 257/E21.011
(58) Field of Classification Search .......... 257/E21.017, 257/E21.02
See application file for complete search history.

(56) References Cited

U.S. PATENT DOCUMENTS

| 6,583,031 | B2 * | 6/2003 | Lin .............................. 438/459 |
| 6,635,919 | B1 * | 10/2003 | Melendez et al. ............ 257/312 |
| 6,798,029 | B2 * | 9/2004 | Volant et al. ................. 257/415 |
| 7,085,122 | B2 * | 8/2006 | Wu et al. ...................... 361/277 |

* cited by examiner

*Primary Examiner*—Stephen W Smoot
(74) *Attorney, Agent, or Firm*—Daryl W. Schnurr

(57) ABSTRACT

A process of manufacturing parallel-plate microstructures by integrating the microstructures in a chip using a CMOS process is provided. A MEMS variable capacitor, a tunable bandpass filter, tunable matching networks, and capacitive RF-MEME switches all having vertically movable components and are integrated into a chip.

17 Claims, 17 Drawing Sheets

Figure 17A
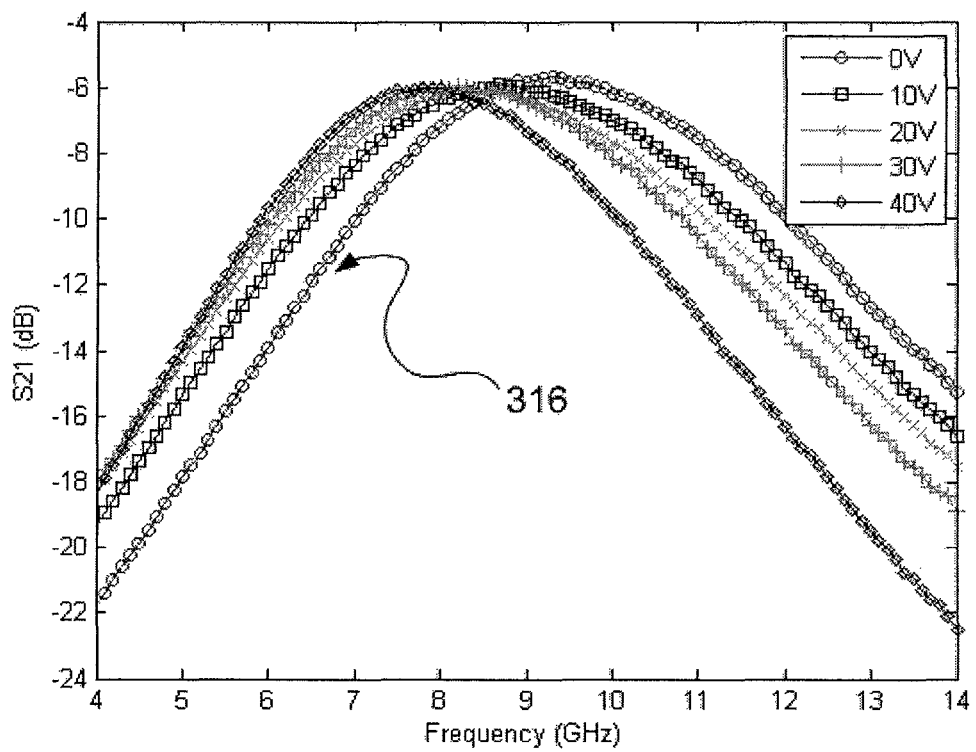
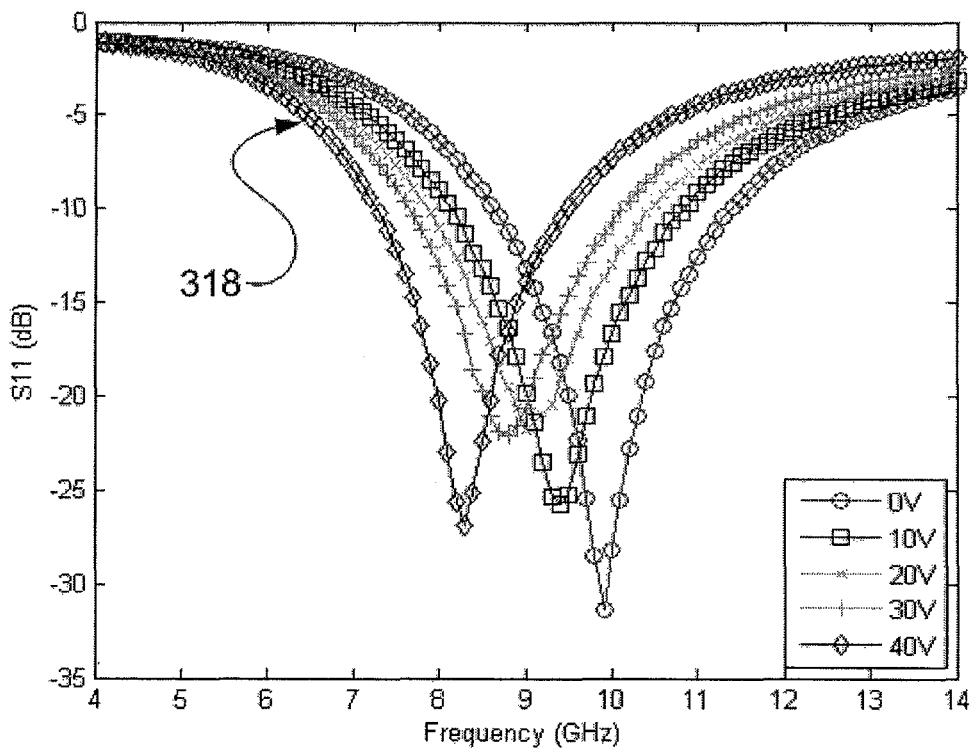
Figure 17 B

MEMS BASED RF COMPONENTS WITH VERTICAL MOTION AND PARALLEL-PLATE STRUCTURE AND MANUFACTURE THEREOF USING STANDARD CMOS TECHNOLOGIES

BACKGROUND OF THE INVENTION

1. Field of the Invention

This invention relates to MEMS based RF components and a method of fabrication thereof, using CMOS technologies. The components are parallel-plate microstructures with vertical motion and include variable capacitors, filters, adaptive matching networks, reconfigurable amplifiers and switches. A process of manufacturing the CMOS-MEMS RF devices uses a dry reactive-ion etching process and a wet etching process.

2. Detailed Description of the Prior Art

It is known to have electronic systems in which all of the components are integrated into a single small-size wafer and packaged as a chip. It is known in active semi-conductor process technology to have all of the components integrated into a single chip. However, with radio frequency (RF) passive components, as the transmitter chip size becomes smaller and smaller, RF passives remain a bottleneck for system miniaturization.

The advances of microelectronics manufacturing technology have led to system-on-chip; a process by which all the components of an electronic system are integrated into a single small size wafer packaged as a chip. Compared to the active semiconductor process technology, there has been less attention to the miniaturization of radio frequency (RF) passive components and as the transmitter chip size becomes smaller and smaller, RF passives remain a bottleneck for system miniaturization. RF micro-electro-mechanical system (MEMS) components are good candidates to substitute the bulky off-chip RF passives in the existing RF integrated circuits (RFICs) due to their good RF performance and miniaturized dimensions. The fabrication of these MEMS devices in a commercially available complementary metal-oxide-semiconductor (CMOS) technology can further enhance the system performance with respect to integration and manufacturing cost.

MEMS variable capacitors can be used as tuning elements in several RF systems including tunable filters, voltage-controlled oscillators (VCOs) and impedance matching networks. It is known to use MEMS technology to design variable capacitors with superior performance (See U.S. Pat. No. 6,373,682 to Goodwin-Johanson et al.; U.S. Pat. No. 6,418,006 to Liu et al.; U.S. Pat. No. 6,355,534 to Cheng et al; M. Bakri-Kassem et. al., "Two movable-plate nitride-loaded MEMS variable capacitor", IEEE Trans. Microw. Theory Tech., vol. 52, no. 3, pp. 831-837, March 2004; M. Bakri-Kassem et. al.; "A high-tuning-range MEMS variable capacitor using carrier beams", Can. J. Elect. Comput. Eng., vol. 31, no. 2, pp. 89-95, Spring 2006; A. Oz et. al., "CMOS-compatible RF-MEMS tunable capacitors", IEEE MTT-S Int. Microw. Symp. Dig., vol. 1, pp. A97-A100, June 2003). These capacitors are classified as either lateral-interdigital or parallel-plate capacitors. Lateral-interdigital MEMS capacitors demonstrate a better linear tuning characteristic than parallel-plate capacitors, whereas parallel-plate capacitors exhibit a higher quality factor and lower parasitic inductance.

It is known in the art to use CMOS-compatible processes to fabricate lateral-interdigital MEMS devices as disclosed in U.S. Pat. No. 6,458,615 to Fedder et. al.; U.S. Pat. No. 5,970,315 to Carley et. al.; U.S. Pat. No. 7,026,184 to Xie et al.; A. Oz et. al., "CMOS-compatible RF-MEMS tunable capacitors", IEEE MTF-S Int. Microw. Symp. Dig., vol. 1, pp. A97-A100, June 2003, each of which is incorporated herein by reference. Parallel-plate variable capacitors are known and can be designed for higher capacitance values with a smaller area, but have not been fabricated using CMOS processes.

SUMMARY OF THE INVENTION

It is an object of the present invention to provide a manufacturing process of parallel-plate MEMS microstructures with vertical motion by employing standard CMOS technologies. One advantageous feature of the disclosed fabrication process, as described below, is that it does not require any extra film deposition or lithographic patterning steps as opposed to the known MEMS fabrication processes. RF-MEMS parallel-plate structures with vertical motion, such as variable capacitors, capacitive bridges and also capacitive switches are created out of the metallization and dielectric layers of the used CMOS technology. A composite metal (e.g., Al) and dielectric (e.g. silicon dioxide) structural layer is used for MEMS devices and one or more metal layers (e.g. Al) is used as the sacrificial layer that allows release of the microstructures within a CMOS chip.

According to one embodiment, the method includes forming a released parallel-plate microstructure integrated in a CMOS chip. The MEMS device consists of two parallel plates such that the top plate comprises of a composite metal/dielectric layer and the bottom plate consists of a composite dielectric/metal/dielectric layer. The CMOS chip may include an active CMOS circuitry for such an embodiment.

The method further includes anisotropic reactive-ion etching (RIE) of the CMOS dielectric layer (e.g. silicon dioxide). One of the multiple metal layers of the CMOS layer stack is used as an etch resistant mask. Portions of the CMOS dielectric layer which is not covered by the metal mask will be removed during this stage and the sacrificial layer and the CMOS substrate (e.g. silicon) will be exposed on these areas.

The method further includes wet isotropic and anisotropic etching of the exposed sacrificial layer and the CMOS substrate for a controlled amount of time, respectively. The metal sacrificial layer is removed to form an air gap between the plates of the MEMS device. The removal of the silicon substrate is necessary to form a trench under the device and to improve its RF performance. The method also includes removing the etch resistant metal layer used as a mask during the first RIE stage of the CMOS dielectric layer.

The method further includes drying of the released MEMS structures in a critical-point dryer (CPD) system in order to prevent from stiction between the parallel plates and after wet etching of the sacrificial layer. In addition, the method includes a second RIE of the CMOS dielectric layer for a controlled amount of time to remove portions of the dielectric on top of the top plate of the MEMS device and also on top of the bonding pads for electrical contact and signal routing.

In another embodiment, the method includes thinning of the dielectric layer present in the dielectric/metal and dielectric/metal/dielectric composite layers of the top and bottom plates of the microstructure, respectively. The controlled wet etching of the dielectric layer allows adjusting the air gap between the plates and also results in lowering the mechanical stiffness of the plates reducing the actuation voltage of the MEMS device.

According to other embodiments, the method may include time controlled anisotropic and then isotropic reactive-ion etching of the CMOS substrate right after the first RIE of the CMOS dielectric layer and before the wet etching of the sacrificial layer and the substrate. The combination of both reactive-ion etching and wet etching of the substrate is desirable since it results in a deeper trench while maintaining a small amount of undercut for structures and circuitry other than the MEMS devices on the CMOS chip.

It is a further object of the present invention to provide a MEMS variable capacitor built in CMOS technology. According to one embodiment, the MEMS variable capacitor includes a first curled-plate including a first composite metal/dielectric layer and a first underlying bottom plate having a composite dielectric/metal/dielectric layer. The plates of the disclosed RF-MEMS variable capacitor are intentionally curled upward to control the tuning performance of the device.

In another general aspect, the present invention is directed to an integrated tunable band-pass filter implemented with CMOS technology. The disclosed filter comprises of a coupled-line structure having a plurality of parallel-plate MEMS variable capacitors with vertical motion attached to the pair of transmission lines and used to tune the filter's centre frequency.

It is a further object of the present invention to provide integrated RF-MEMS tunable matching networks. According to one embodiment, the matching network includes a coplanar waveguide (CPW) transmission line periodically loaded with parallel-plate capacitive MEMS bridges between the signal and ground lines. Both the effective electrical length and characteristic impedance of the line is adjusted by employing the variable loading effect of the MEMS bridges. In another embodiment, the tunable matching circuit consists of a lumped-element network comprising of an integrated micromachined inductor with a high quality factor and an RF-MEMS parallel-plate variable capacitor. The disclosed matching circuit enables the implementation of CMOS reconfigurable amplifiers operating with their maximum efficiency under variable source/load impedance conditions.

A process of manufacturing parallel-plate microstructures is provided, the process comprising integrating parallel-plate microstructures in a chip using a CMOS process.

Preferably, a method comprises manufacturing a microstructure that is vertically actuated using a CMOS process.

A MEMS variable capacitor is fabricated in CMOS technology. The capacitor comprises a first curled-plate including a first composite metal/dielectric layer and a first underlying bottom plate having a composite dielectric/metal/dielectric layer, the two plates being curled upward to control tuning performance of the capacitor, the capacitor being integrated in a chip.

An integrated tunable band-pass filter is fabricated with CMOS technology. The filter comprises a coupled-line structure having a plurality of parallel-plate MEMS variable capacitors attached to a pair of transmission lines and used to tune the filter's center frequency, the filter being integrated in a chip.

RF MEMS tunable matching networks comprise a coplanar waveguide transmission line periodically loaded with parallel-plate capacitive MEMS bridges between signal and ground lines. The MEMS bridges are adjustable by employing a variable loading effect and the networks are integrated in a chip.

A tunable matching circuit comprises a lumped-element network comprising an integrated micromachined inductor with a high-quality factor and an RF MEMS parallel-plate variable capacitor. The circuit is integrated in a chip.

An integrated intelligent adaptive system comprises RF MEMS structures having a compact size and low power consumption with improved RF performance, the system being integrated in a chip.

Capacitive RF-MEMS switches comprise a coplanar waveguide transmission line and a vertically movable part integrated in a chip.

BRIEF DESCRIPTION OF THE DRAWINGS

FIG. 17A is a graph of the measured insertion loss of the integrated tunable band-pass filter;

FIG. 17B is a graph of the measured return loss of the integrated tunable band-pass filter;

DETAILED DESCRIPTION OF A PREFERRED EMBODIMENT

Figure 1:
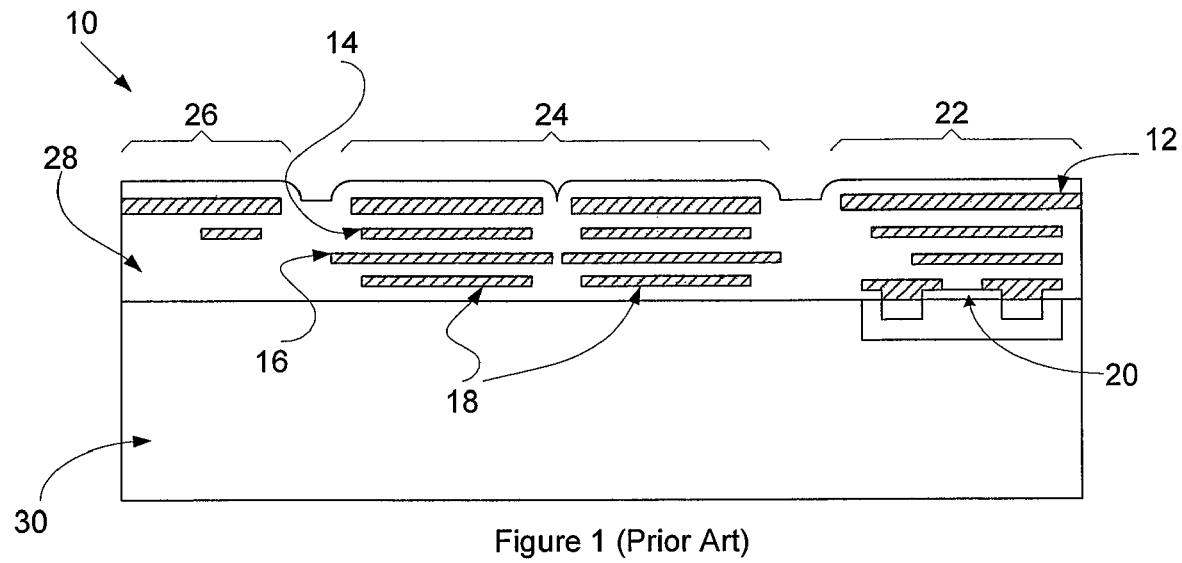
FIG. 1 is a cross-sectional view of a prior art CMOS chip after being fabricated.

FIGS. 1 to 4 illustrate various post-processing stages used to implement the parallel-plate microstructure with vertical motion 10 according to one embodiment of the present invention. FIG. 1 shows the die after the standard CMOS processing. This could be any standard CMOS technology with at least four interconnect metal layers 12, 14, 16, and 18 and poly silicon layers 20. The CMOS die may include CMOS active circuitries 22, MEMS structures 24 and interconnect regions 26 formed using the conventional CMOS processing on a substrate material 30 such as silicon, for example. The metal layers 12, 14, 16 and 18 may comprise aluminium (Al) or copper (Cu). The dielectric material 28 between these metal layers could be any oxide material such as silicon dioxide.

Figure 2:
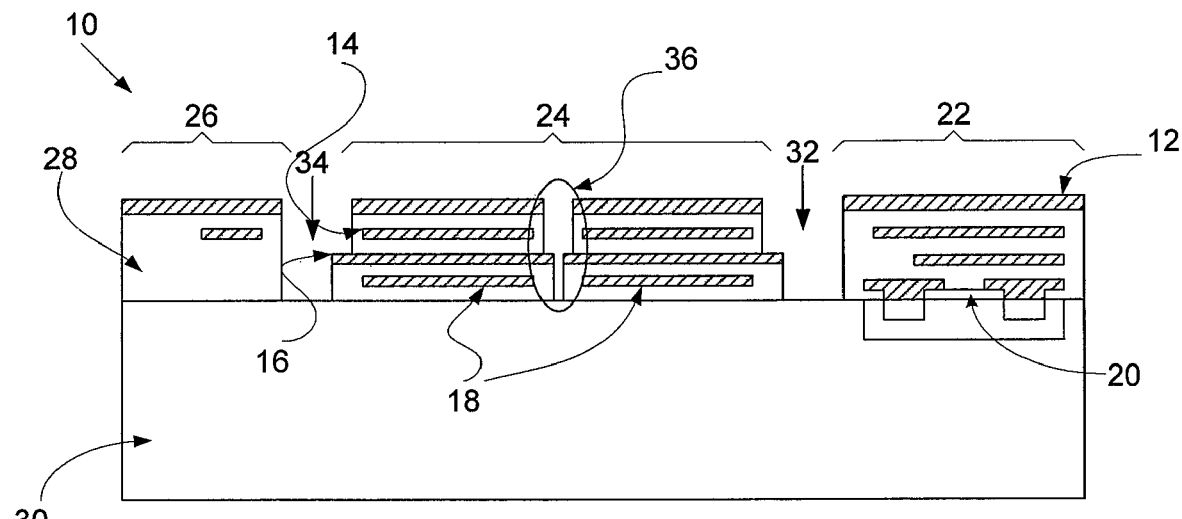
FIG. 2 is a cross-sectional view of the chip in FIG. 1 after $1^{st}$ reactive-ion etching (RIE) of the dielectric according to prior art.

FIG. 2 shows the microstructure 10 after anisotropic RIE removal of portions of the CMOS dielectric layer 28 according to the prior art. Readers may refer to U.S. Pat. No. 6,458,615 to Fedder et al., which is incorporated herein by reference. The same reference numerals are used in FIGS. 2 to 10 as those used in FIG. 1 for those parts that are identical. One of the multiple CMOS metal interconnect layers 12 in this case is used as an etch resistant material. Portions of the CMOS dielectric 28 which is not protected by the etch resistant material is removed during this stage. Open windows 32 and 34 in the dielectric layer 28 are used to access the silicon substrate 30 and also the sacrificial metal layer 16. Release holes 36 are also included on the MEMS structures 24 in order to facilitate the access to the sacrificial layer 16 between the two parallel plates of the MEMS structure 14 and 18.

Figure 3:
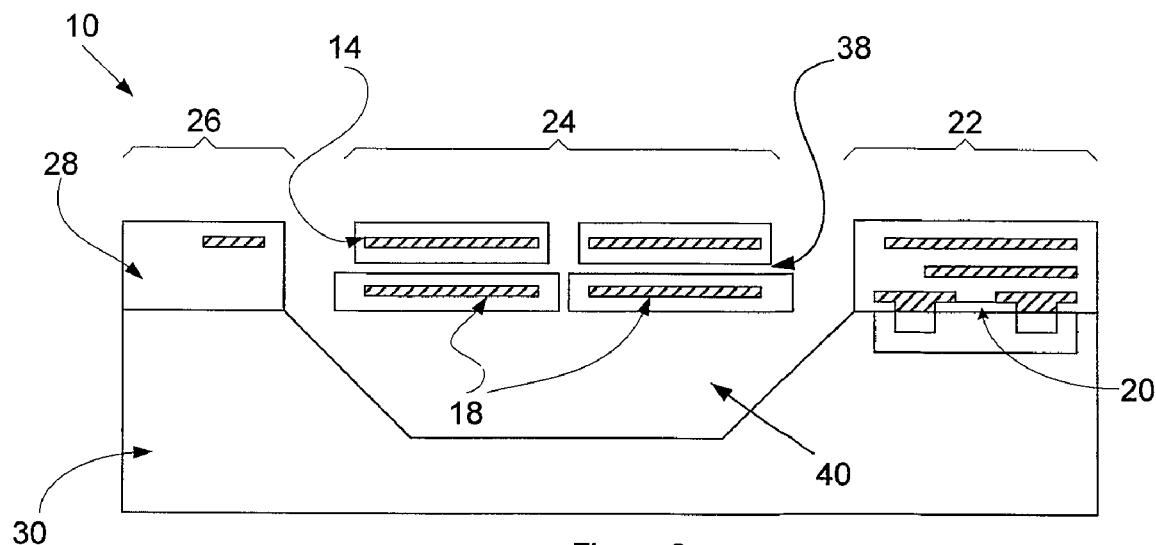
FIG. 3 is a cross-sectional view after wet etching and removing the sacrificial layer, the mask layer and portions of the substrate.

FIG. 3 illustrates the die after wet etching of the etch resistant layer 12 and the sacrificial layer 16 in FIG. 2 and also removing portions of the silicon substrate 30. The metal layers 12 and 16 are removed using a wet metal etchant (e.g., Phosphoric-Acetic-Nitric (PAN) and Hydrogen Peroxide ($H_2O_2$)). The trench 40 in the substrate 30 is created using a wet anisotropic silicon etchant (e.g., diluted 5% electronic grade TMAH). The air-gap 38 between the parallel-plates 14 and 18 may be on the order of 0.5-0.7 μm, and the trench 40 may have a depth on the order of 75-100 μm to obtain a good RF performance. During this stage the metal layers 14 and 18 of the MEMS structure 24 are protected from being etched by the wet etchant by keeping a dielectric layer around them. This is accomplished by extending the etch resistant metal layer 12, in FIG. 1, over the top of the structural metal layers 14 and 18. On the other hand, wherever an air-gap is required, the sacrificial layer 16 is extended beyond the etch resistant metal layer 12 and exposed after the RIE of the CMOS dielectric layer 28.

Figure 4:
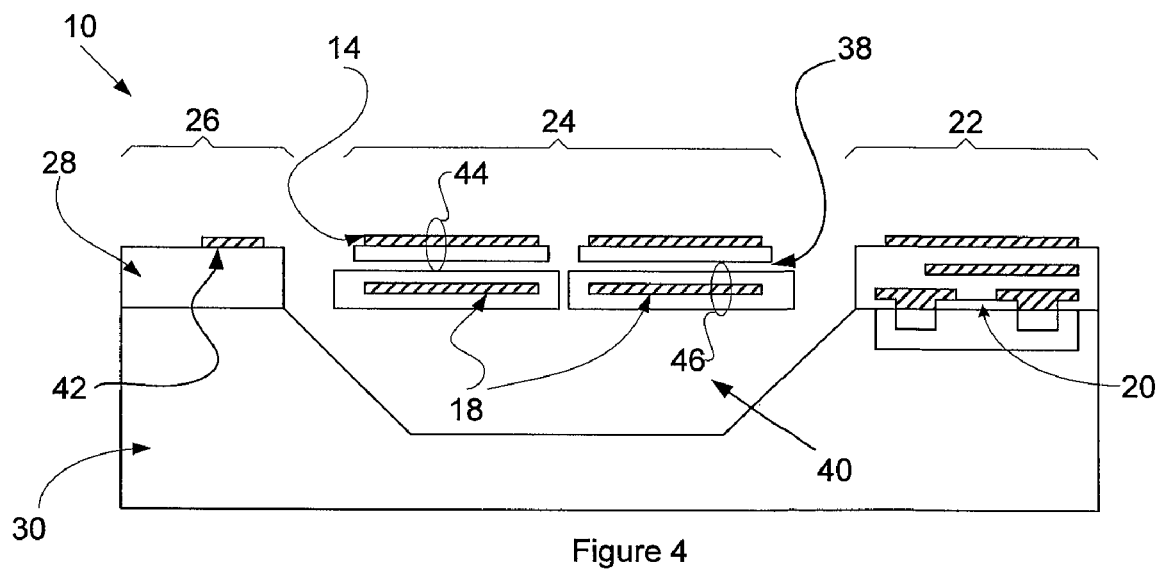
FIG. 4 is a cross-sectional view of the chip after $2^{nd}$ RIE of the oxide.

FIG. 4 illustrates the die in FIG. 3 after being dried using a Critical Point Dryer (CPD) system. This is necessary to avoid the failure of the device due to the stiction of the parallel-plates 14 and 18 of the MEMS structure 24 after wet release. During this stage a $2^{nd}$ RIE is performed to remove portions of the CMOS dielectric layer 28 on top of the pads 42 used for electrical signal routing and test. According to the described embodiment, the microstructure 10 consists of a parallel-plate MEMS structure 24 comprising a composite metal/dielectric top plate 14, an air-gap 38, and a composite dielectric/metal/dielectric bottom plate 18, a CMOS active circuitry 22 and interconnect pads 42.

Figure 5:
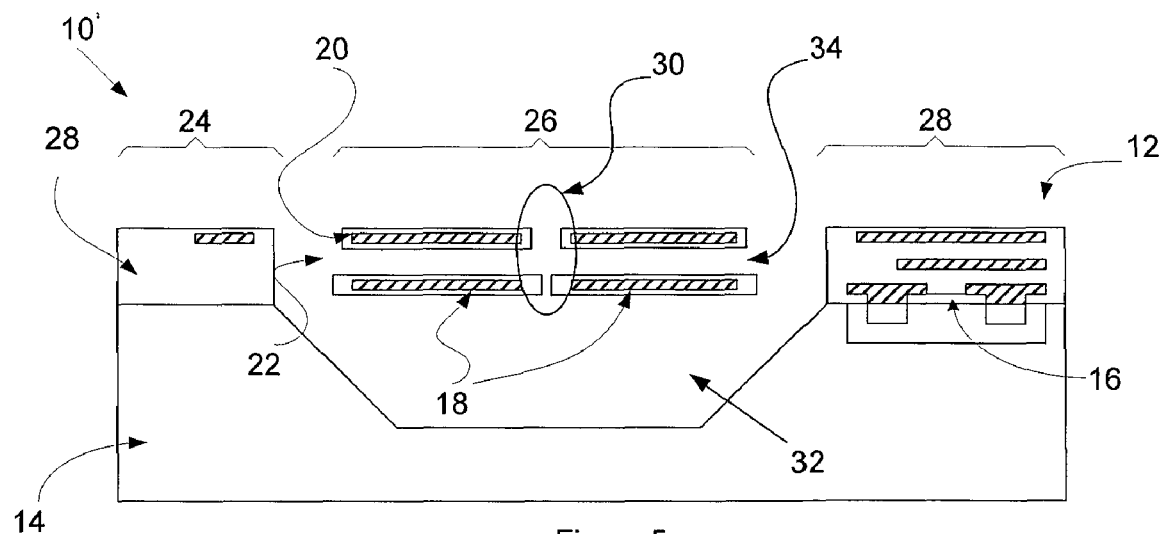
FIG. 5 is a cross-sectional view of the chip before the $2^{nd}$ RIE in case the encapsulating oxide needs to be thinned using time-controlled oxide etching.
Figure 6:
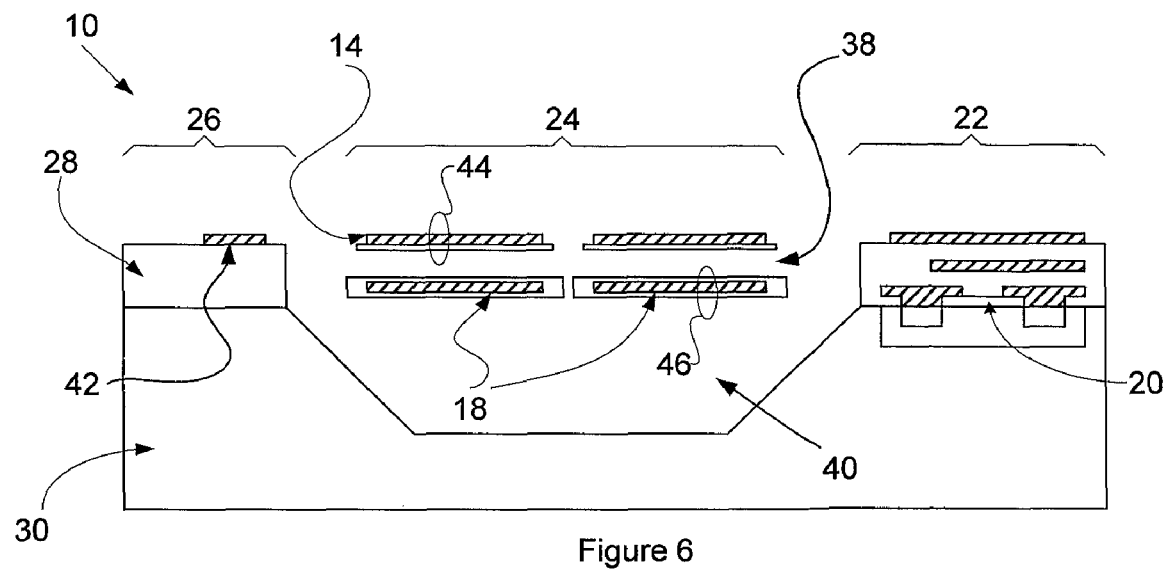
FIG. 6 is a cross-sectional view of the chip after $2^{nd}$ RIE and removing the oxide on top of the test pads.

FIGS. 5 and 6 show another embodiment of the present invention where an extra time-controlled wet etching is used to decrease the thickness of the dielectric layer 26. This will increase the air-gap 38 between the plates and also reduce the mechanical stiffness of the structural composite layers 44 and 46 in FIG. 6. The dielectric layer 28 on top of the pads 42 is removed using the $2^{nd}$ anisotropic etching as shown in FIG. 6. The anisotropic RIE step of FIG. 6 may be similar to that of FIG. 4, except portions of the dielectric is removed using wet etching in FIG. 5 and it will take a shorter time to expose the pads 42.

Figure 7:
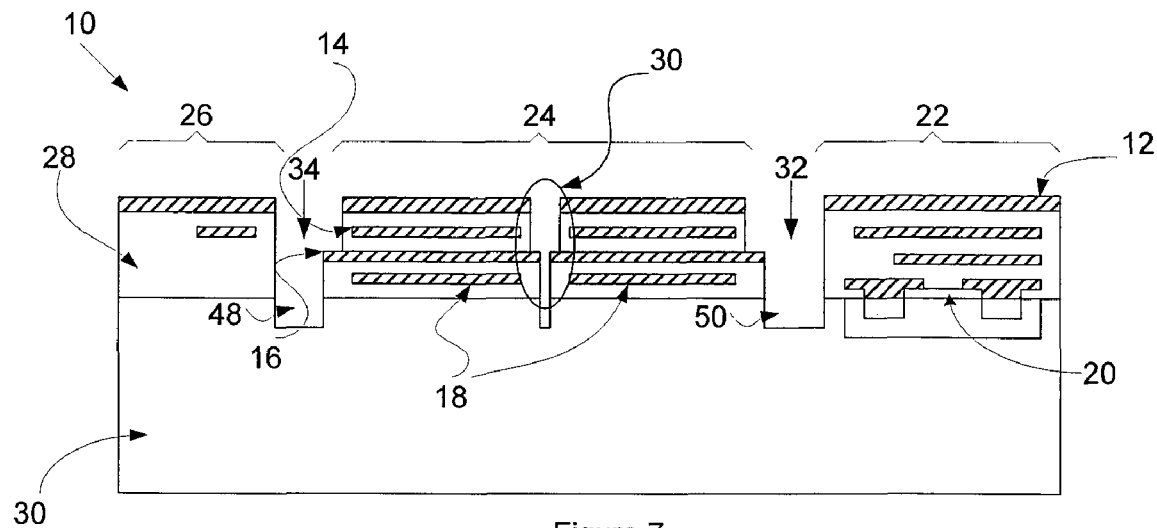
FIG. 7 is a cross-sectional view of the chip in FIG. 2 if anisotropic RIE of the silicon is required to obtain deep trench in the substrate.
Figure 8:
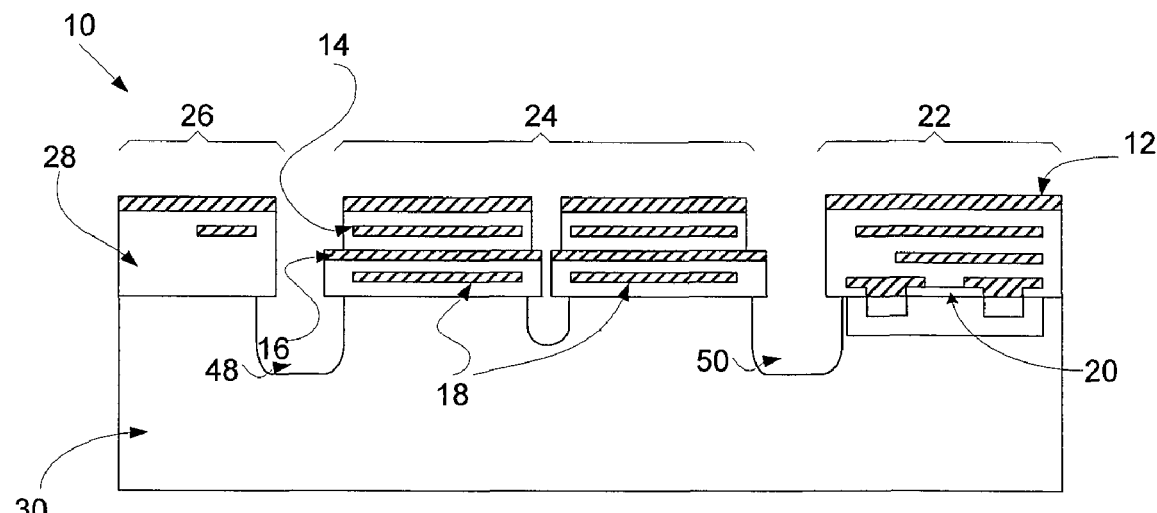
FIG. 8 is a cross-sectional view of the chip in FIG. 7 after using isotropic RIE of the silicon.
Figure 9:
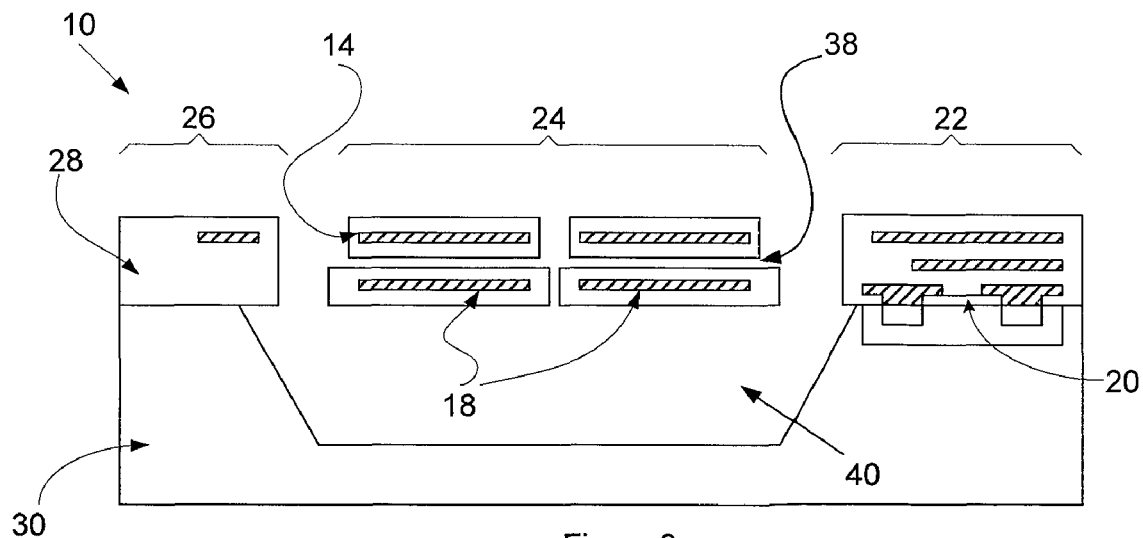
FIG. 9 is a cross-sectional view of the chip in FIG. 8 after wet etching and removing the sacrificial layer, the mask layer and portions of the substrate.
Figure 10:
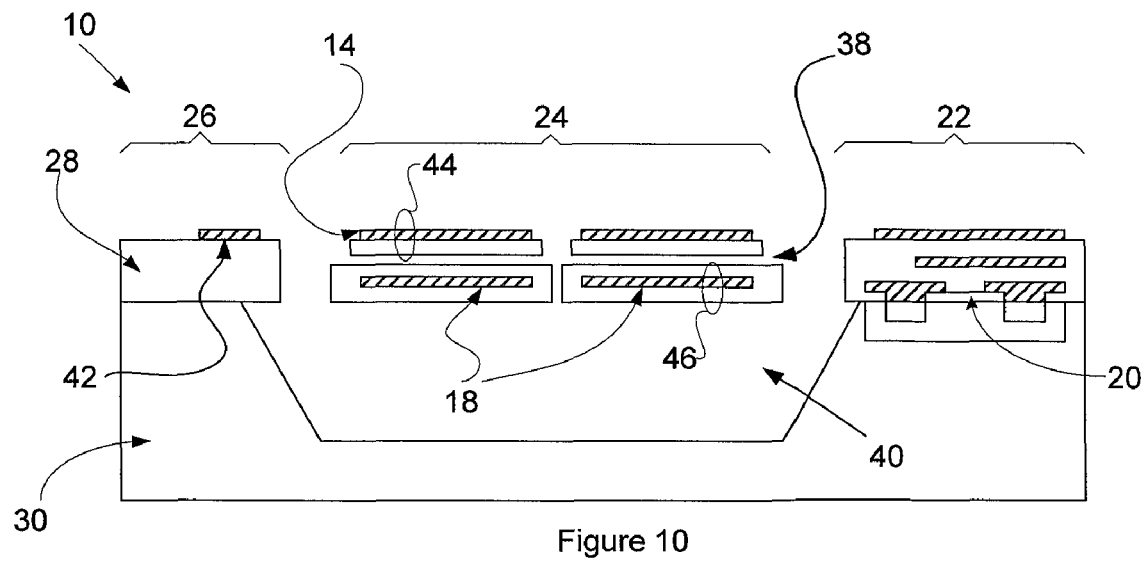
FIG. 10 is a cross-sectional view of the chip in FIG. 9 after RIE etching of the oxide layer on top of the test pads.

According to an alternative embodiment, as shown in FIGS. 7 to 10, the process may include reactive ion etching of both the dielectric layer 28 and silicon substrate 30 using the etch resistant metal layer 12 as a mask. An anisotropic RIE is used to remove portions of the dielectric layer 28 not covered by the mask 12 to create openings 32 and 34. The openings are used to expose the substrate 30 and the sacrificial layer 16. The anisotropic RIE of the dielectric layer in FIG. 7 is similar to that of FIG. 2. An anisotropic reactive ion etching is then used to etch through portions of the substrate 30 around the MEMS structure. The depth of the trenches 48 and 50 created in the substrate 30 can be on the order of 20-30 μm with well-defined side-walls. FIG. 8 illustrates the device 10 after the isotropic reactive ion etching of portions of the substrate 30 in order to increase the depth of the trenches 48 and 50 and also the undercut under the MEMS structure 24. This will increase the final depth of the trench 40 under the MEMS structure 24 shown in FIG. 9. During the next stage as illustrated in FIG. 9, wet etching is used to remove the mask layer 12, sacrificial layer 16 and also the substrate 30. The depth of the trench 40 using the described embodiment is on the order of 125-150 μm. The final stage of this embodiment is etching away the dielectric layer on top of the pads 42 using anisotropic RIE as the ones in FIGS. 4 and 6.

Thus, various embodiments of the disclosed fabrication process, enables the removal of the sacrificial metal layers from the stack of metal/dielectric in a commercial CMOS fabrication process. This allows the fabrication of parallel-plate microstructures with vertical motion which can be integrated with any type of CMOS circuitry on the same chip device. Further, the process provides the ability to create trenches under the MEMS device which enhance the high frequency performance of the device by eliminating the parasitic effects of the substrate. In addition, for an embodiment where a combination of reactive ion etching and wet etching of the substrate 30 is used, a deeper trench can be obtained while maintaining a small amount of undercut for circuitry other than the MEMS devices on the CMOS chip. Among other things, this makes the process very suitable for making integrated parallel-plate microstructures for millimetre wave applications. For example, the process of the present invention may be used to create compact high quality factor MEMS variable capacitors.

Figure 11:
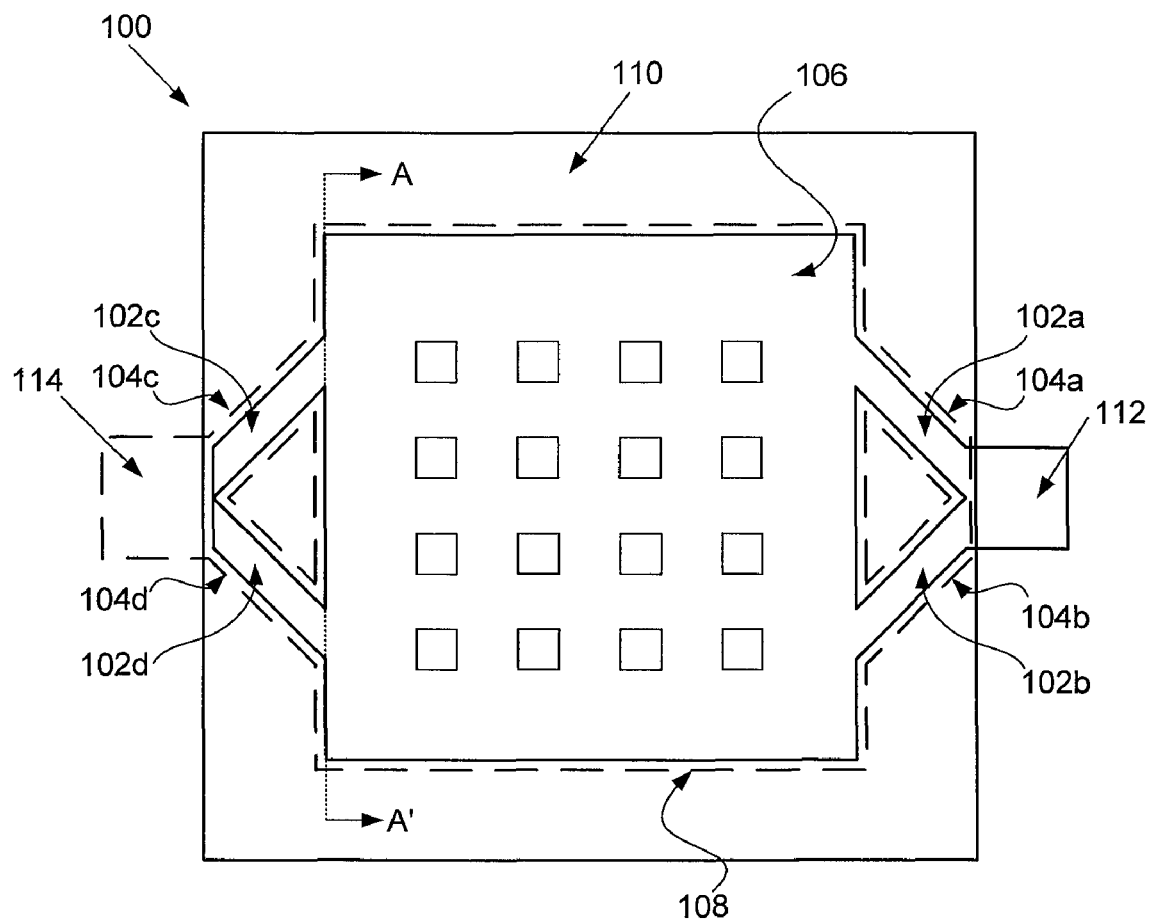
FIG. 11 is a 2-D top view of the curled-plate tri-state type capacitor.

FIG. 11 shows a schematic view of a tri-state type MEMS variable capacitor 100 having an eight-beam spring system with four beams 102a-d for the top plate 106 and four beams 104a-d for the bottom plate 108. MEMS device 100 includes a deep trench 110 created by removing portions of the substrate under the device. The RF pads 112 and 114 are used for high-frequency signal routing and are anchored on the substrate with a safe distance from the trench 110.

Figure 12:
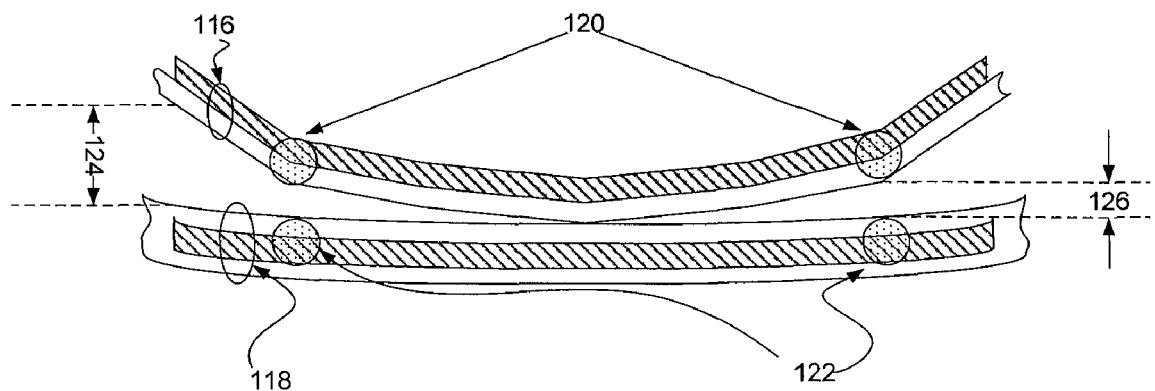
FIG. 12 is a schematic diagram of the curled-plate tri-state capacitor which represents the cross section AA' in FIG. 11.
Figure 13:
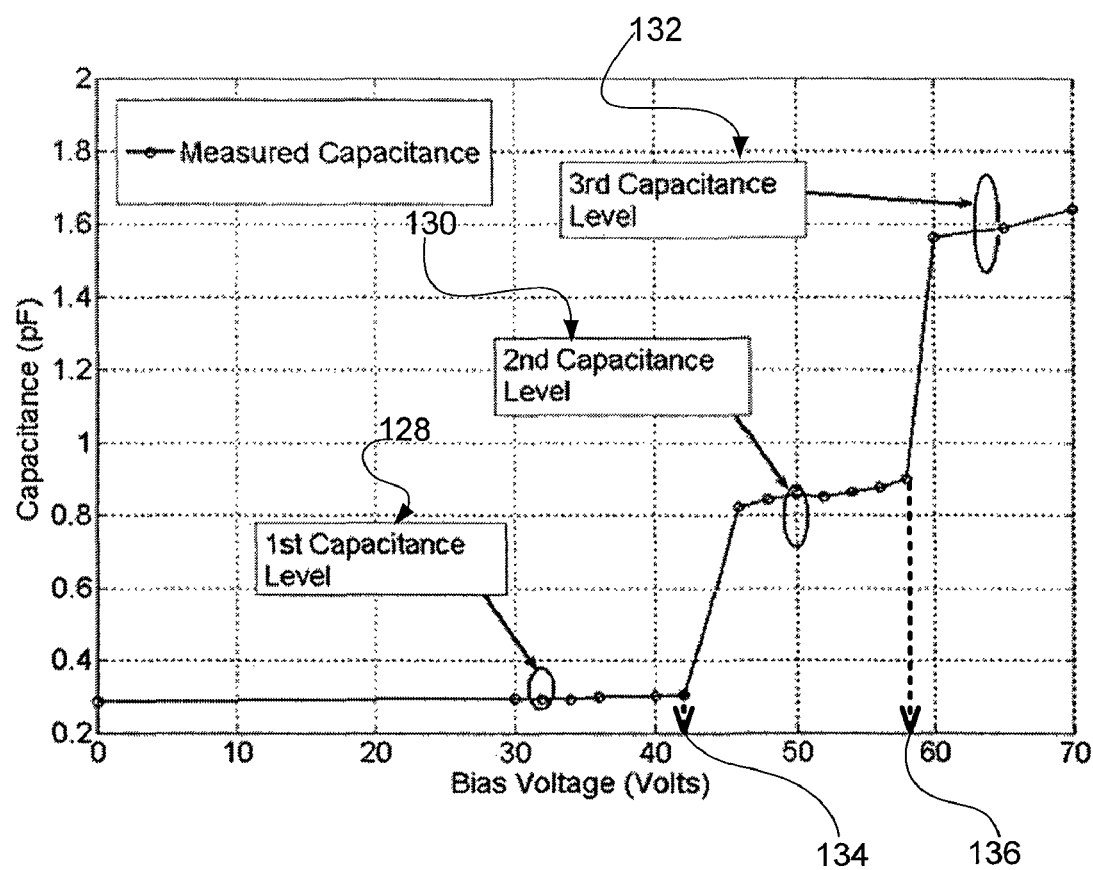
FIG. 13 is a graph of the measured tuning characteristic of the curled-plate tri-state capacitor.

FIG. 12 shows the cross-sectional view AA' of the MEMS device 100 in FIG. 11. The top plate 106 consists of a composite metal/dielectric thin film layer stack 116 and the bottom plate 108 comprises of a composite dielectric/metal/dielectric thin film layer stack 118 as illustrated in FIG. 12. A composite thin film layer including metal and dielectric materials, such as 116 and 118 of FIG. 12, may curl up due to the difference in residual stress between the metal and dielectric materials after release. This curling property of the composite layers 116 and 118 along the cross-section AA' as shown in FIG. 12 is exploited in the design of the tri-state MEMS variable capacitor 100. The joint points 120 of the top plate 106 with the beam system 102a-d and the joint points 122 of the bottom plate 108 with the beam system 104a-d are designed such a way to achieve a tri-state capacitance-voltage characteristic for the MEMS device 100. FIG. 13 shows the measured capacitance of the MEMS device 100 versus applied bias voltage. The first capacitance state 128 corresponds to a bias voltage less than the $1^{st}$ pull-in voltage 134. When the bias voltage is increased beyond the $1^{st}$ pull-in voltage 134, the top plate 106 and bottom plate 108 are collapsed on each other at the joint points 120 and 124 in FIG. 12 and the second capacitance state 130 is achieved. The capacitance stays the same until the second pull-in happens for a bias voltage higher than the $2^{nd}$ pull-in voltage 136. At this point both plates are entirely resting on top of each other and the third capacitance state 132 is achieved.

Figure 14:
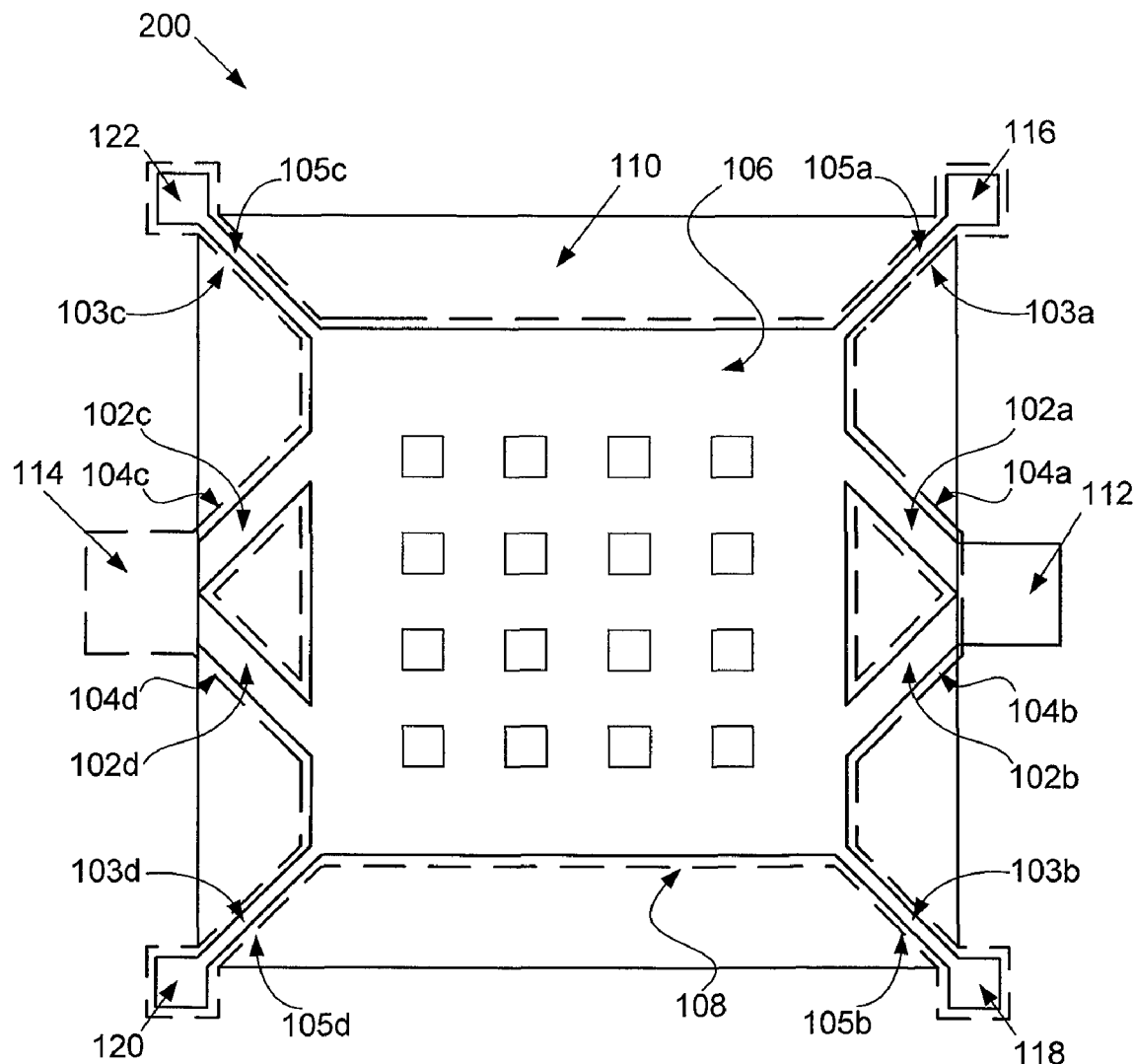
FIG. 14 is a 2-D top view of the analog continuous type capacitor.
Figure 15:
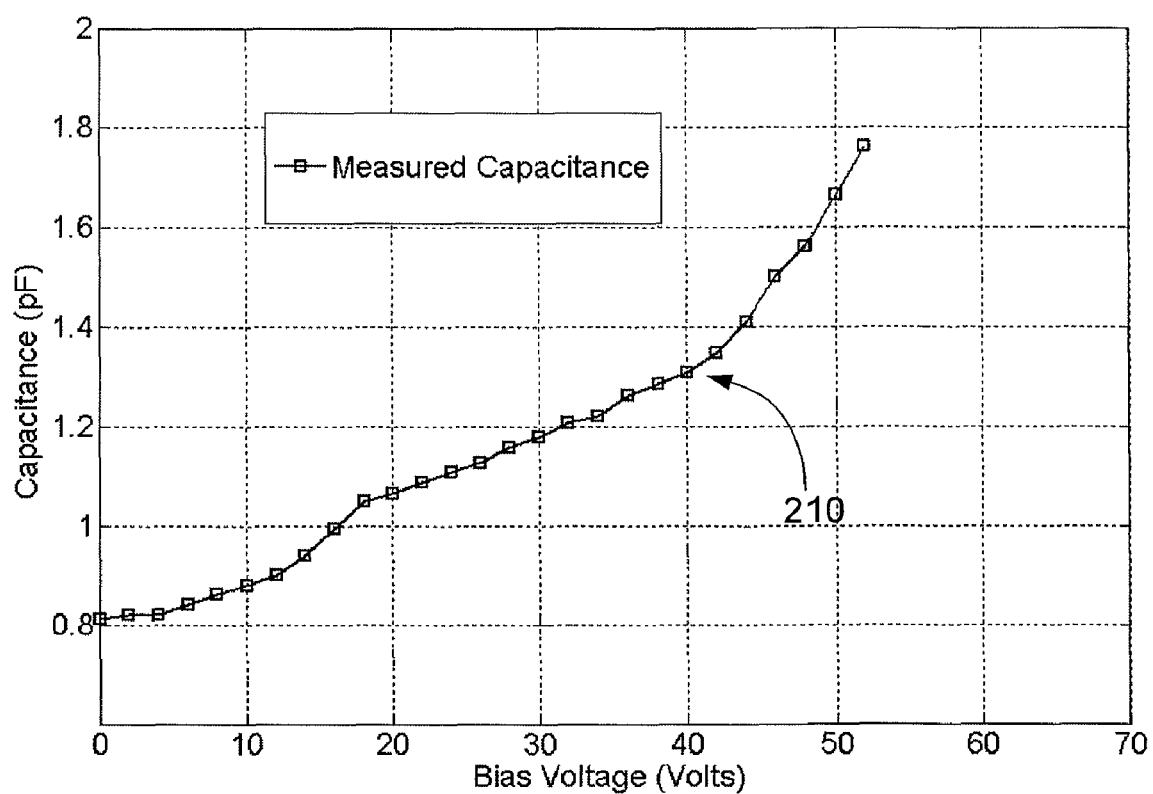
FIG. 15 is a graph of the measured tuning characteristic of the analog continuous type capacitor in FIG. 15.

The analog continuous curled-plate capacitor 200 is illustrated in FIG. 14. The same reference numerals are used in FIG. 14 as those used in FIG. 11 for those parts that are identical. The MEMS device 200 has eight main beams 102a-d and 104a-d and eight additional corner beams 103a-d and 105a-d that mechanically connect the top plate 106 and bottom plate 108 of the capacitor to the anchor points 112-122 on the CMOS substrate. The long and narrow corner beams 103a-d and 105a-d do not contribute a meaningful spring constant in the transverse direction; however, they do portray the high restoring forces in plane, where the corner beams attempt to prevent the top and bottom plates from curling up as high as the ones in the disclosed tri-state capacitor device 100 shown in FIG. 11. The measured capacitance-voltage characteristic of the MEMS device 200 is presented in FIG. 15. The disclosed analog continuous capacitor demonstrates a continuous tuning response 210. Unlike the conventional parallel-plate MEMS variable capacitors (See U.S. Pat. No. 6,418,006 to Liu et al.), the MEMS device 200 has a tuning range higher than 50% which is not limited by the pull-in effect.

Figure 16:
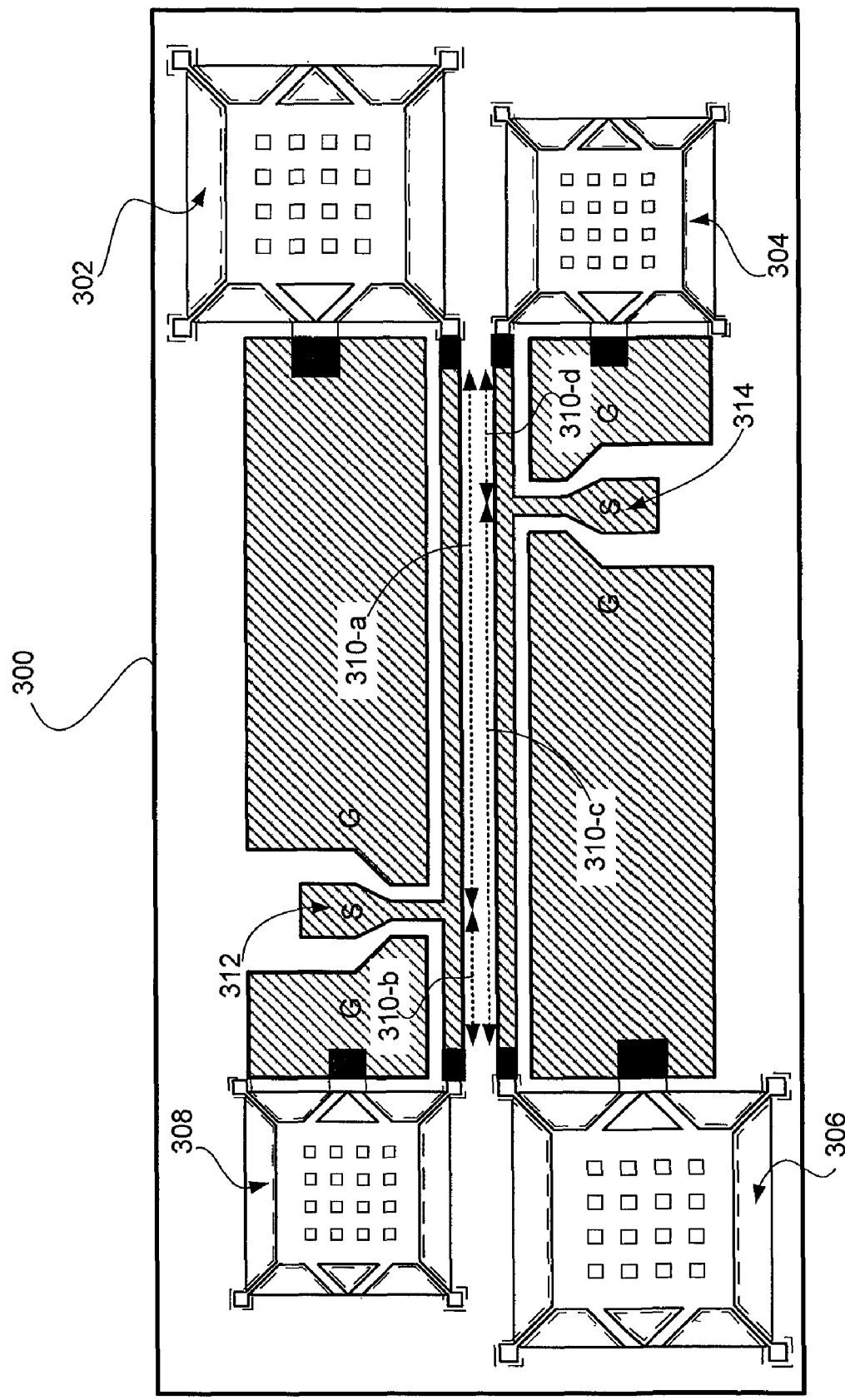
FIG. 16 is a schematic view of the integrated tunable band-pass filter.

FIG. 16 shows a MEMS device 300 exploiting the analog continuous curled-plate capacitor 200 as the tuning elements. The MEMS device 300 is an integrated microwave tunable band-pass filter including a plurality of MEMS parallel-plate variable capacitors 302, 304, 306 and 308. As can be seen in FIG. 16, the MEMS device 300 also includes a coupled coplanar waveguide (CPW) transmission line system 310. The RF signal is coupled to the filter 300 through the input/output ports 312 and 314. The input port 312 is coupled to the line section 310a using a tapped line input coupling 310b. The output port is connected to the line section 310c through a tapped line coupling 310d. The coupled resonator sections 310a and 310c are loaded with MEMS variable capacitors 302 and 306, respectively. The effective electrical length of each resonator section 310a and 310c and hence the filter center frequency is tuned by using these MEMS variable capacitors. The effective electrical length of the transmission line sections 310b and 310d and hence the input/output coupling is adjusted by the MEMS variable capacitors 308 and 304, respectively. This enables the tuning of the filter center frequency and bandwidth together. FIG. 17A illustrates a measured insertion loss 316 and FIG. 17B illustrates a measured return loss 318 of the MEMS device 300 for different bias voltages used to tune the center frequency of the device 300.

Figure 18:
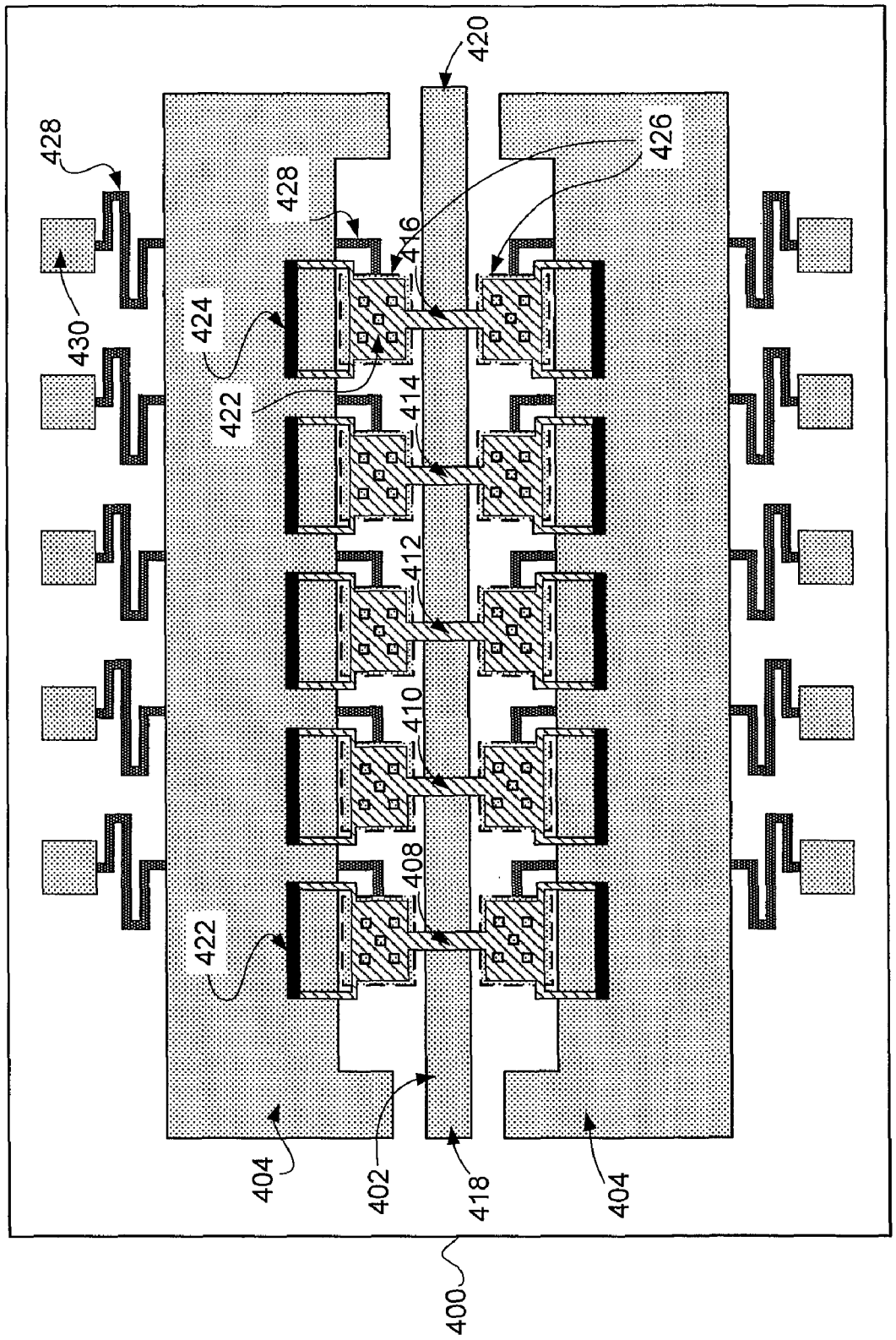
FIG. 18 is a schematic view of the integrated distributed type impedance matching network with MEMS capacitive bridges.
Figure 19:
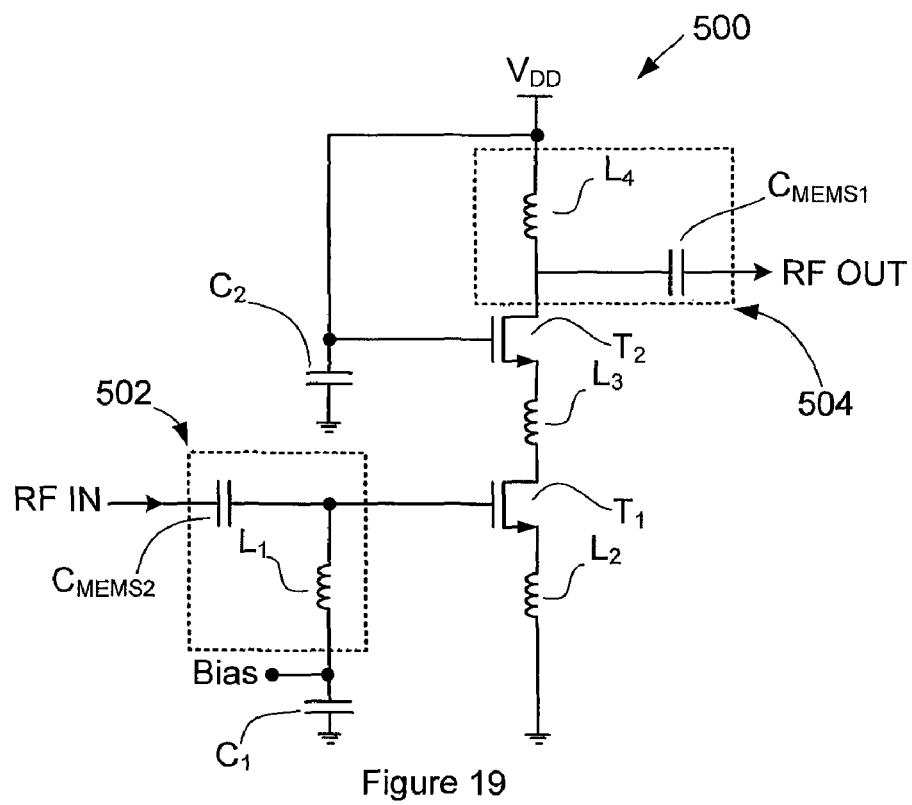
FIG. 19 is a circuit diagram of a CMOS amplifier with tunable input/output matching units.

FIGS. 18 and 19 show extension of the idea of using the disclosed MEMS variable capacitors of the present invention in integrated adaptive impedance matching networks. FIG. 18 shows an integrated adaptive impedance matching network 400 based on distributed MEMS transmission lines (DMTL) technique. Fabrication of the MEMS network 400 is based on the processing technique presented in FIGS. 1 to 4 similar to the one that used for the MEMS variable capacitor device 100 except the inclusion of the trench in the CMOS substrate. The matching network 400 has a CPW transmission line structure loaded with a plurality of MEMS capacitive bridges 408-416 between the signal line 402 and the ground planes 404. The variable loading effect of the MEMS bridges 408 to 416 is used to tune the characteristic impedance and also the phase delay of the CPW line in order to match different impedances between the input and output ports 418 and 420. Each capacitive MEMS bridge 408 to 416 comprises of a top plate 422 which is anchored on the ground planes 404 at the anchor points 424. The capacitive MEMS Bridge also includes bottom actuation electrodes 426 electrically connected to the bias pads 430 through high-resistivity bias lines 428. Using different states of the matching network 400, by actuating different combinations of capacitive MEMS bridges 408 to 416, it is possible to obtain a good match for a wide frequency band of operation within the X-Band.

FIG. 19 illustrates the schematic circuit diagram of a CMOS amplifier 500 with lumped-element MEMS adaptive matching networks 502 and 504. Here the lumped-element structure is utilized instead of the DMTL matching network 400 due to the large on-chip wavelength at the lower operating frequency of the CMOS amplifier. The input and output matching networks 502 and 504 consist of a MEMS variable capacitor such as the ones disclosed in the present invention and a micro-machined on-chip inductor as illustrated in FIG. 19. The application of the disclosed processing technique yields both reconfigurable matching and also improved RF performance by reducing the coupling to the CMOS'substrate and increasing the quality factor of the integrated inductors and capacitors. The device 600 is capable of achieving an optimum power gain for variable source and load impedance conditions.

Figure 20:
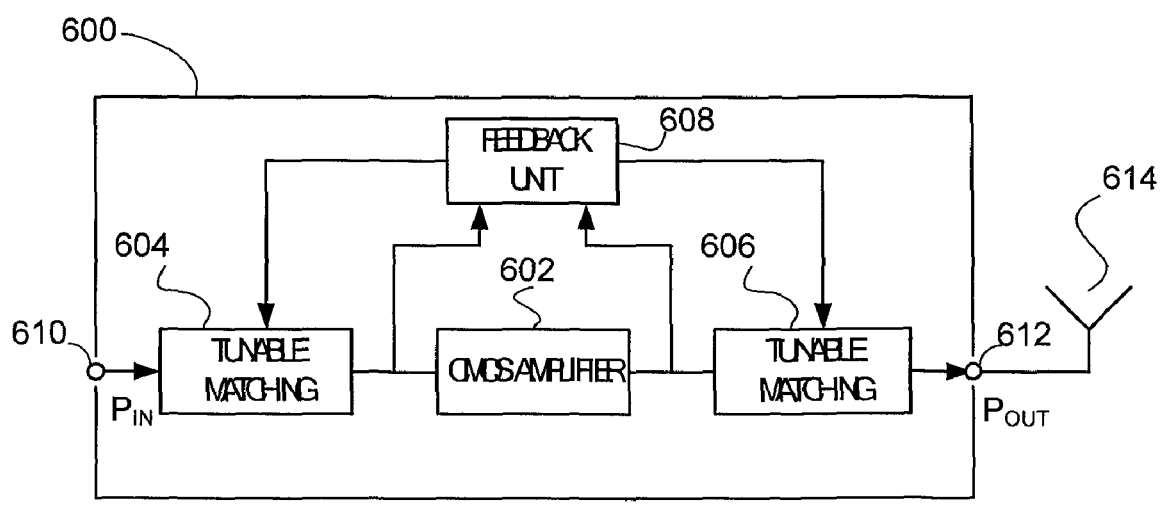
FIG. 20 is a block diagram of an integrated intelligent reconfigurable amplifier

As shown in the block diagram of FIG. 20, a fully integrated intelligent module 600 consists of a CMOS amplifier unit 602, reconfigurable input and output matching units 604 and 606, and a feedback unit 608, all integrated into a single CMOS chip device. Considering the case where the module 600 is used in a transmitter, the output port 612 is connected to an antenna device 614 as shown in FIG. 20. In this case the load impedance is the input impedance of the antenna which could change due to the variable ambient conditions. The intelligent module 600 can compensate for these variations. The same concept applies for the input matching when the module is used in a receiver where the source impedance at the input port 610 is variable. Another advantageous feature of the module 600 is that it can adapt itself for the variations in the active device parameters used in the CMOS amplifier unit. This could happen due to the operating temperature drift or aging over time and also fabrication tolerances.

Figure 21:
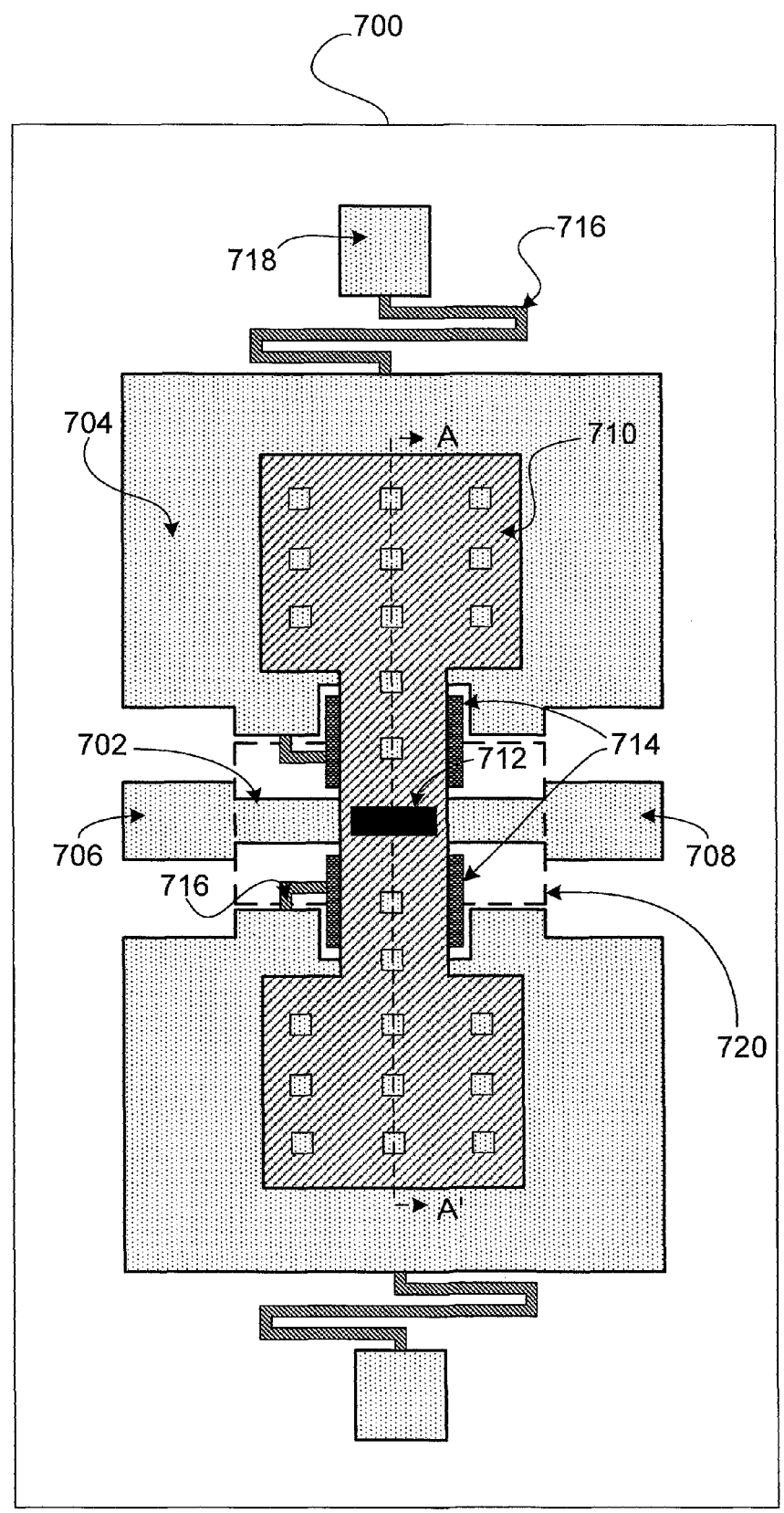
FIG. 21 is a schematic view of the integrated capacitive RF-MEMS switch.

FIG. 21 shows a schematic view of a shunt type capacitive RF-MEMS switch 700 having a CPW transmission line structure and a vertically movable part 710. The movable part 710 being connected to the signal line 702 at the anchor point 712 and suspended above the ground lines 704. The movable part 710 creates a capacitor between the signal line 702 and the ground lines 704 with two different states said ON and OFF states. In the ON state, the movable part 710 is not actuated and the capacitive loading on the signal line is very small with no effect on the transmitted signal from the input port 706 to the other output port 708. In the OFF state of the switch 700, the movable part 710 is actuated and moves towards the ground lines forming a high capacitance loading on the signal line 702. This provides a short circuit to block the signal transmission between the input and output ports 706 and 708, respectively. A DC voltage is applied between the actuation electrodes 714 and the movable part 710 to transform the switch between the ON and OFF states. The DC bias of the actuation electrodes 714 is provided through high-resistivity bias lines 716 which are connected to the bias pads 718. The shunt type capacitive RF-MEMS switch 700 also includes a trench 720 beneath the signal line 702. The trench 720 improves the performance of the switch 700 by removing the parasitic effects of the CMOS substrate.

Figure 22:
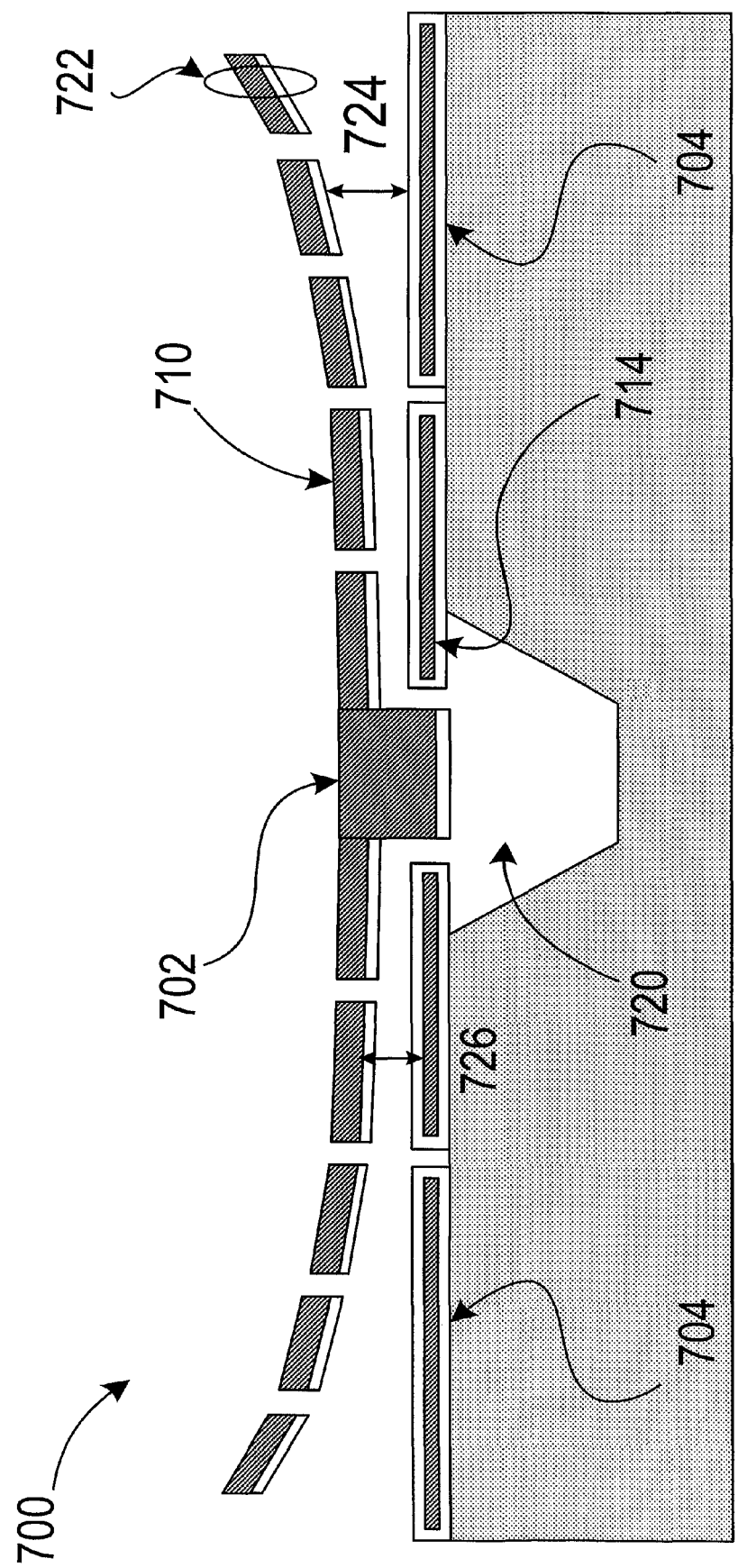
FIG. 22 is a schematic diagram of the capacitive RF-MEMS switch which represents the cross section AA in FIG. 21.

FIG. 22 shows the cross-sectional view A-A' of the shunt type capacitive RF-MEMS switch 700 in FIG. 21. The same reference numerals are used in FIG. 22 as those used in FIG. 21 for those parts that are identical. The movable part 710 consists of a composite metal/dielectric thin film layer stack 722. The composite thin film layer stack 722 curls upward due to the difference in the residual stress of the constituent metal and dielectric layers of the composite stack layer after removing the sacrificial layer and releasing of the MEMS device 700. This property of the composite layer stack 722 is used to increase the air-gap 724 between the movable part 710 and the ground layer underneath 704 in order to decrease the ON state capacitance between the signal line 702 and ground lines 704. This will increase the capacitance ratio between the OFF state and ON state of the switch 700 improving its performance. The air-gap 726 between the actuation electrodes 714 and the movable part 710 is maintained as small as possible in order to reduce the actuation voltage of the MEMS device 700.

Figure 23:
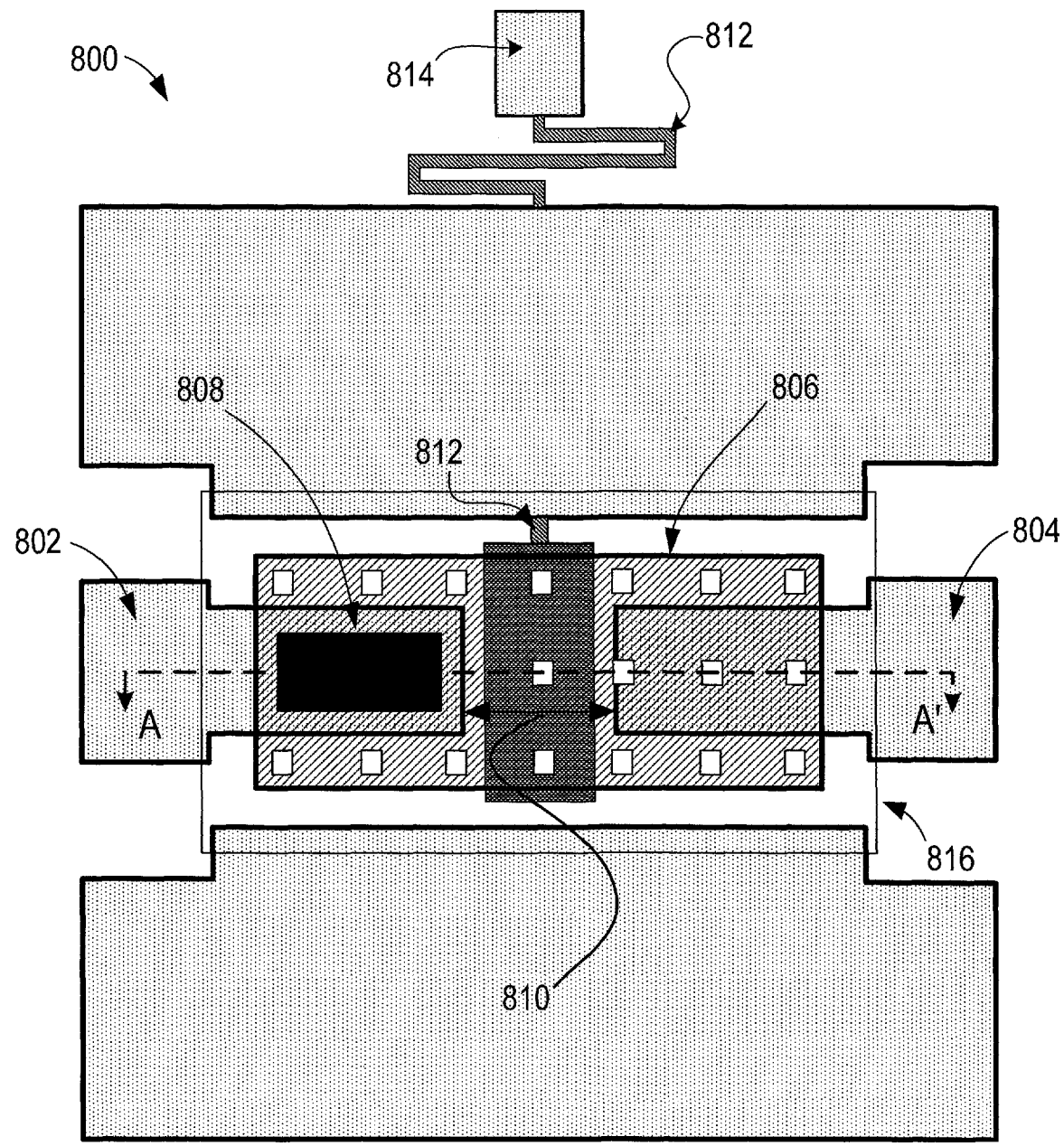
FIG. 23 is a schematic view of the integrated series type capacitive RF-MEMS switch.

FIG. 23 shows a schematic view of a series type capacitive RF-MEMS switch 800 consisting of a vertically movable part 806 suspended over a gap 810 in the signal line. The movable part is anchored at one end 808 on the input signal line 802 and overlaps at the other end with the output signal line 804. The movable part 806 creates a capacitor between the input signal line 802 and the output signal line 804 with two different states said ON and OFF states. In the OFF state the movable part 806 is not actuated and the capacitive coupling between the input signal line 802 and output signal line 804 is very small with no signal transmitted from the input port 802 to the other output port 804. In the ON state of the switch 800, the movable part 806 being actuated and moved towards the output signal line 804 forming a high coupling capacitance between the signal lines 802 and 804. This provides an RF signal transmission between the input and output ports 802 and 804, respectively. A DC voltage is applied between the actuation electrode 812 and the movable part 806 to transform the switch between the ON and OFF states. The DC bias of the actuation electrodes 812 is provided through high-resistivity bias lines 814 which are connected to the bias pads 816. The series type capacitive RF-MEMS switch 800 also includes a trench 818 beneath the signal line. The trench 818 improves the performance of the switch 800 by removing the parasitic effects of the CMOS substrate.

Figure 24:
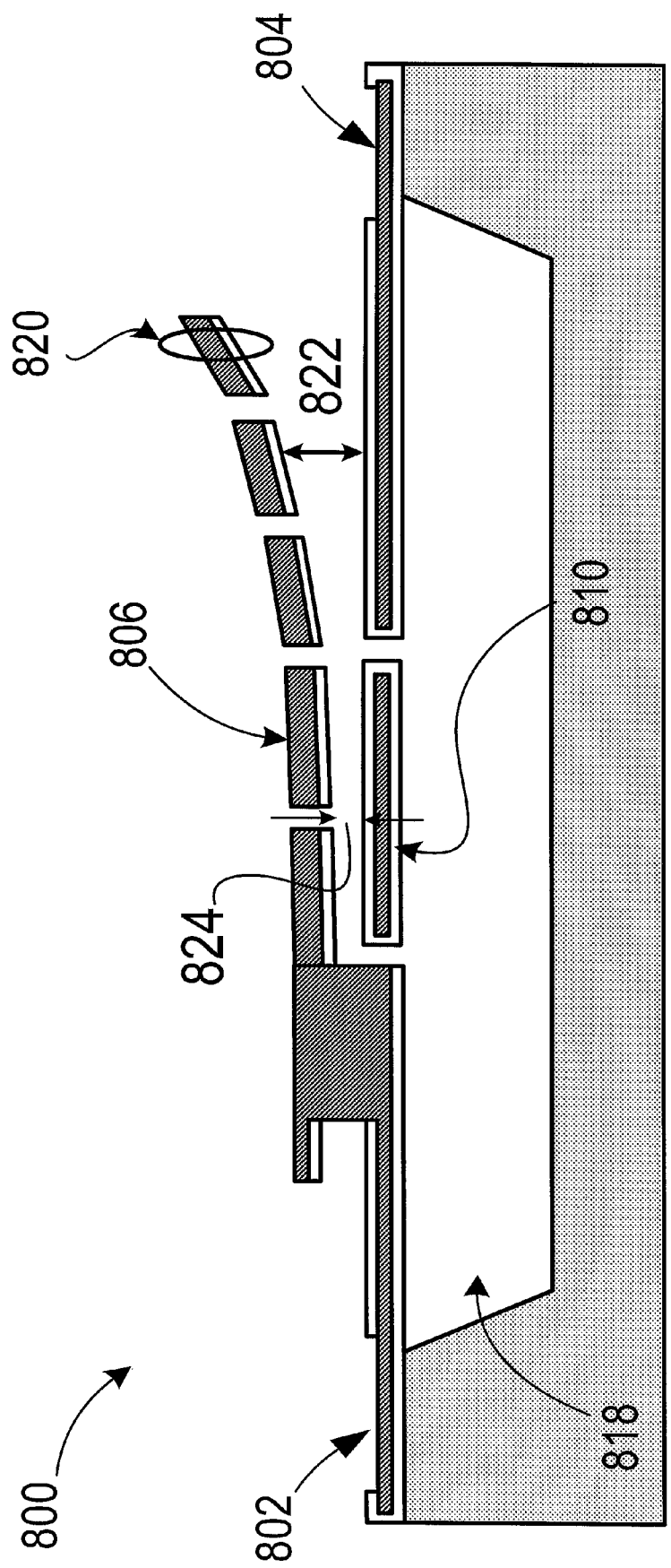
FIG. 24 is a schematic diagram of the series type capacitive RF-MEMS switch which represents the cross section AA' in FIG. 23.

FIG. 24 shows the cross-sectional view A-A' of the series type capacitive RF-MEMS switch 800 in FIG. 23. The same reference numerals are used in FIG. 24 as those used in FIG. 23 for those parts that are identical. The movable part 806 consists of a composite metal/dielectric thin film layer stack 820. The composite thin film layer stack 820 curls upward due to the difference in the residual stress of the constituent metal and dielectric layers. This property of the composite layer stack 820 is used to increase the air-gap 822 between the movable part 806 and the underlying output signal line 804 in order to decrease the OFF state coupling capacitance between the input signal line 802 and the output signal line 804. This will increase the isolation of the RF-MEMS switch 800 in the OFF state. The air-gap 824 between the actuation electrode 810 and the movable part 806 is maintained as small as possible in order to reduce the actuation voltage of the MEMS device 800.

Although the disclosed capacitive RF-MEMS switches have been described as single pole single throw (SPST) switches with preferred embodiments thereof, it should be noted that various changes and modifications will be apparent to those skilled in the art. Therefore, unless otherwise stated such changes and modifications depart from the scope of the present invention, they should be constructed as being included therein. For example, the idea can be extended to any other type of multi-port RF-MEMS switches such as single pole double throw (SP2T), SP3T, SPNT, C-, R- and T-type switches and also switch matrices.

We claim:

1. A process of manufacturing microstructures, said process comprising constructing microstructures in a chip with at least one vertically movable component using a CMOS process, achieving vertical motion by constructing an air gap beneath the at least one vertically movable component, creating the air gap by selectively removing one or more sacrificial layers using a CMOS process, one or more of the sacrificial layers including at least one metal layer.

2. A process as claimed in claim 1, including the steps of constructing parallel plate microstructures, being parallel plates comprising a top plate and a bottom plate, constructing said top plate to be inside at least one vertically movable component and locating said air gap between said top plate and said bottom plate, said top plate and said bottom plate being constructed of at least two composite structural layers.

3. A process as claimed in claim 2, including the step of constructing each composite structural layer comprises at least one metal layer and at least one dielectric layer.

4. A process as claimed in claim 1, including the steps of integrating said at least one vertically movable component in said chip with active CMOS circuitry.

5. A process as claimed in claim 4, wherein said chip has a substrate and said process includes the steps of forming a deep trench in said substrate to improve performance of said at least one vertically movable component.

6. A process as claimed in claim 1, including the steps of constructing said microstructures using said CMOS process comprised of dry reactive-ion etching and wet etching processes.

7. A process as claimed in claim 6, including the steps of using anisotropic reactive-ion etching of a CMOS dielectric layer and using one of multiple metal layers of a CMOS layer stack as an etch resistant mask with portions of the CMOS dielectric layer which are not covered by said mask being removed to expose a sacrificial layer and a CMOS substrate.

8. A process as claimed in claim 7, including the steps of using wet isotropic and anisotropic etching of the exposed sacrificial layer and the CMOS substrate for a controlled amount of time, respectively.

9. A process as claimed in claim 8 wherever the microstructures are MEMS structures, including the step of removing the metal sacrificial layer to form an air gap between plates of the MEMS structures.

10. A process as claimed in claim 9, including the steps of removing the CMOS substrate and forming a trench under the MEMS structure to improve an RF performance and removing said etch resistant mask.

11. A process as claimed in claim 10 wherein the plates are parallel plates, including the step of drying the MEMS structures in a critical-point dryer system in order to prevent stiction between the parallel plates.

12. A process as claimed in claim 11, including the steps of carrying out a second reactive-ion etching of the CMOS dielectric layer for a controlled amount of time to remove portions of the dielectric layer on top of a top plate of the MEMS structure and also on top of bonding pads for electrical contact and signal routing.

13. A process as claimed in claim 9, including the step of thinning the dielectric layer present in a metal/dielectric layer and dielectric/metal/dielectric composite layers of top and bottom plates of the microstructure, respectively, by controlled wet etching.

14. A process as claimed in claim 7, including the steps of carrying out controlled anistropic and then isotropic reactive-ion etching of the CMOS substrate right after a first reactive-ion etching of the CMOS dielectric layer and before the wet etching of the sacrificial layer and of the CMOS substrate.

15. A process as claimed in claim 6, including the steps of using the process to produce one or more of a MEMS variable capacitor, an integrated tunable band pass filter and RF-MEMS tunable matching networks.

16. A process as claimed in claim 1, including the steps of forming multiple interconnect metal layers separated by a dielectric layer.

17. A process as claimed in claim 1 including the step of fabricating one or more microstructures selected from the group of a MEMS variable capacitor; an integrated tunable bandpass filter; RF tunable matching networks, a tunable matching circuit having a lump element network; a tunable matching circuit where there is a controller; RF tunable matching networks with a coplanar waveguide transmission line periodically loaded with parallel-plate capacitive MEMS bridges between signal and ground lines, a controller to change a state of each of the MEMS bridges; CMOS reconfigurable amplifiers; a shunt type capacitive RF-MEMS switch having a coplanar waveguide transmission line and a vertically movable component; a series type capacitive RF-MEMS switch having a coplanar waveguide transmission line with a gap along a signal line; and a parallel-plate microstructure with vertical motion located in one of a phase shifter, voltage-controlled oscillator, switch matrices and any other reconfigurable system built using CMOS technology.

* * * * *